United States Patent [19]
Urayama

[11] Patent Number: 6,002,445
[45] Date of Patent: Dec. 14, 1999

[54] A/D CONVERSION WITH WIDE DYNAMIC RANGE

[75] Inventor: Yoji Urayama, Tokyo, Japan

[73] Assignee: NEC Corporation, Tokyo, Japan

[21] Appl. No.: 09/049,920

[22] Filed: Mar. 30, 1998

[30] Foreign Application Priority Data

Mar. 31, 1997 [JP] Japan ................................. 9-080009

[51] Int. Cl.⁶ .............................. H04N 5/52; H03M 1/12
[52] U.S. Cl. .......................................... 348/572; 348/678
[58] Field of Search .................................. 348/678, 572, 348/573, 673, 254, 255; 341/155, 158

[56] References Cited

U.S. PATENT DOCUMENTS

| | | | |
|---|---|---|---|
| 4,831,378 | 5/1989 | Baars et al. | 348/572 |
| 5,087,973 | 2/1992 | Kawahara | 348/572 |
| 5,121,117 | 6/1992 | Rabii | 348/572 |
| 5,164,726 | 11/1992 | Bernstein et al. | 348/572 |
| 5,270,819 | 12/1993 | Watson | 348/678 |
| 5,719,638 | 2/1998 | Noden | 348/628 |
| 5,757,440 | 5/1998 | Manges et al. | 348/225 |

FOREIGN PATENT DOCUMENTS

| | | |
|---|---|---|
| 62-116063 | 5/1987 | Japan . |
| 2-200442 | 8/1990 | Japan . |
| 2-254659 | 10/1990 | Japan . |
| 3-106269 | 5/1991 | Japan . |
| 3-131177 | 6/1991 | Japan . |
| 6-319060 | 11/1994 | Japan . |

*Primary Examiner*—Victor R. Kostak
*Attorney, Agent, or Firm*—Foley & Lardner

[57] ABSTRACT

An image data signal processor, that includes a clamp circuit for clamping a DC level of an image data signal to a predetermined level to produce a clamped image data signal, an A/D converter for A/D-converting the clamped image data signal into a digital image data signal based on a lower reference voltage and an upper reference voltage, wherein the predetermined level is a minimum level of the A/D converter, and a reference voltage generating section for generating the lower and upper reference voltages from the digital image data signal to send to the A/D converter.

16 Claims, 6 Drawing Sheets

BLACK  WHITE

Fig.5

GLAY(INTERMEDIATE GRADATION)

A/D CONVERSION WITH WIDE DYNAMIC RANGE

BACKGROUND OF THE INVENTION

1. Field of the Invention

The present invention relates to an image data signal processor, and more particularly to an A/D conversion of an image data signal with a wide dynamic range in an image data signal processor.

2. Description of the Related Art

An image data signal processor is used to effectively widen the dynamic range (D) of an image data signal processing circuit, as shown in, for example, Japanese Laid Open Patent Disclosure (JP-A-Showa 62-116063: first conventional example).

Figure 1:
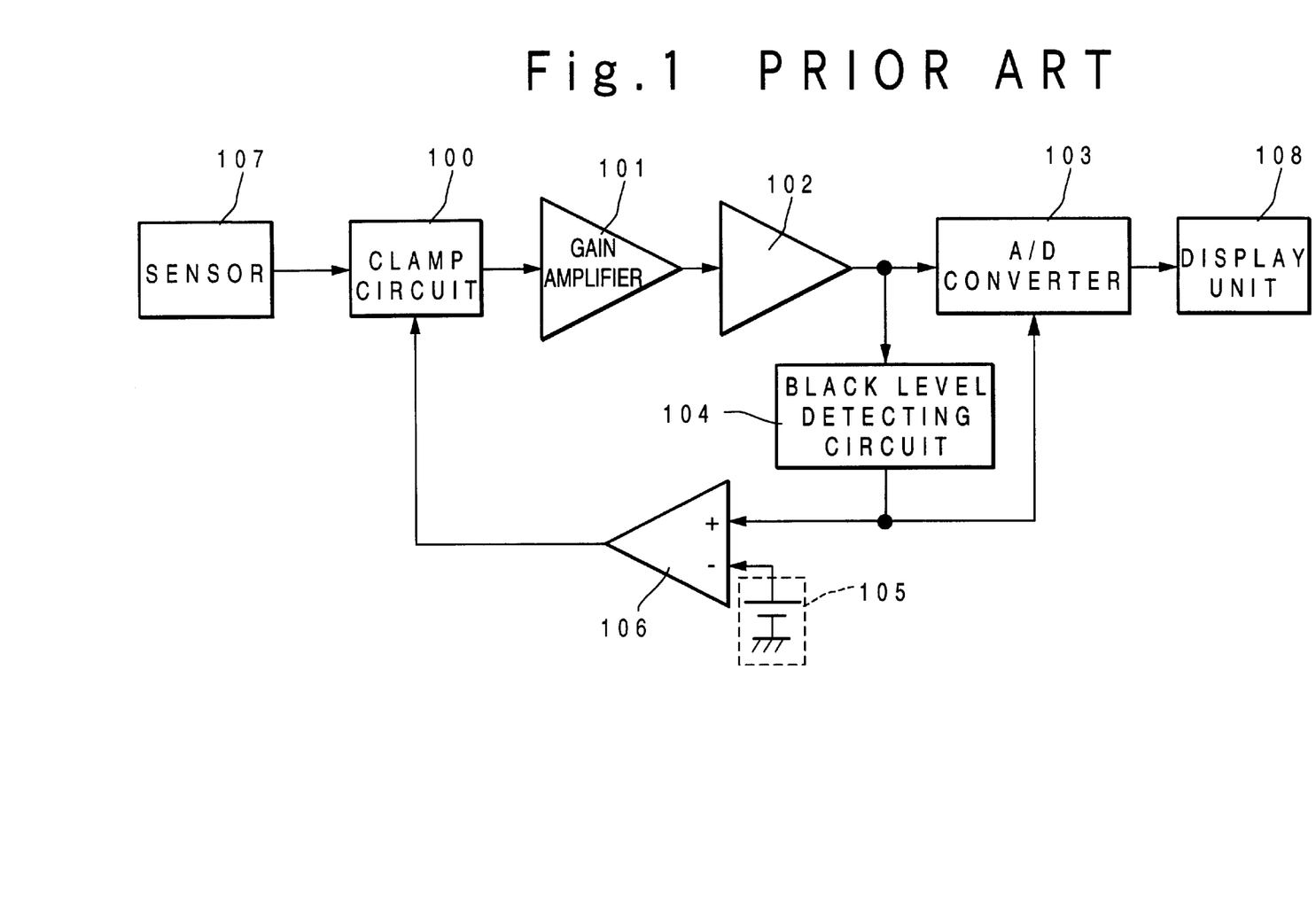
FIG. 1 is a block diagram illustrating the first conventional example of an image data signal processor.

FIG. 1 is a block diagram illustrating the structure of an the first conventional example of image data signal processor. Referring to FIG. 1, a sensor 107 is the sensor which inputs an image data signal. A clamp circuit 100 clamps the image data signal outputted from the sensor circuit 107 to the DC level which is given from an error amplifying circuit 106. A gain amplifier 101 amplifies the output of the clamp circuit 100 with a predetermined gain and a buffer circuit 102 buffers the analog image data signal outputted from the gain amplifier 101. An A/D converter 103 converts the image data signal outputted from the buffer circuit 102 into a digital data signal to output to a display unit. The display unit 108 displays digital image data.

A black level detecting circuit 104 detects a DC level for a black color of the analog image data signal outputted from the buffer circuit 102. A reference voltage generating circuit 105 generates a reference DC level. The error amplifying circuit 106 amplifies the difference between the output of the black level detecting circuit 104 and the reference voltage to output the amplifying result to the clamp circuit 100.

Next, the operation of this first conventional example of an image data signal processor will be described below.

An analog image data signal that is output from the sensor 107 is clamped by the clamp circuit 100 to fix a DC level. Then, the clamped image data signal is amplified with a predetermined gain by the gain amplifier 101. The amplified image data signal is supplied to the A/D converter 103 through the buffer circuit 102. The display unit 108 displays the digital image data outputted from the A/D converter 103.

When an image data signal is A/D-converted, it is desirable to use the dynamic range of the A/D converter 103 in the maximum. For this purpose, the output signal of the buffer circuit 102 is supplied to the black level detecting circuit 104. The black level detecting circuit 104 detects the black signal level of the image data signal outputted from the buffer circuit 102 to the error amplifying circuit 106. The error amplifying circuit 106 compares the predetermined DC level supplied from the reference voltage generating circuit 105 and the DC level of the black image data signal supplied from the black level detecting circuit 104. Then, the error amplifying circuit 106 amplifies the difference between them to output the amplified difference (error) as a clamp voltage to the clamp circuit 100.

In this case, the reference voltage of the reference voltage generating circuit 105 is previously set such that the black level outputted from the black level detecting circuit 104 is coincident with the minimum reference level of the A/D converter 103. Thus, the dynamic range of the A/D converter 103 can be effectively used and the black level of the image data signal can be revised.

However, there are the following problems in the above-mentioned first conventional example of an image data signal processor.

That is, first, there is a case where the dynamic range of the A/D converter 103 is not effectively used. In the conventional image data signal processor, the black level of the image data signal is adjusted to the lower reference voltage of the A/D converter 103 such that the amplitude of the image data signal is effectively allocated to the dynamic range of the A/D converter 103. However, since the maximum level of the image data signal is not detected, there is the case where the signal level of the image data signal is larger or smaller than the upper reference voltage of the A/D converter 103. In these cases, it cannot be accomplished that the image data signal is effectively allocated to the dynamic range of the A/D converter 103.

Second, there is a case where the image data signal is saturated. In the first conventional example of image data signal processor, the black level of the image data signal is adjusted to the lower reference voltage of the A/D converter 103 to effectively allocate the image data signal to the dynamic range of the A/D converter 103. However, since the maximum level of the image data signal is not detected, the image data signal is saturated, when the upper reference voltage of the A/D converter 103 is lower than the maximum level of the image data signal. As a result, the image data signal is impossible to be faithfully reproduced.

Also, a color video printer signal processing circuit is described in Japanese Laid Open Patent Application (JP-A-Heisei 2-200442), in which a DC level is fed back to a clamp circuit provided before an A/D converter such that the dynamic range of the A/D converter can be used in maximum.

In Japanese Laid Open Patent Application (JP-A-Heisei 2-254659), an image data signal processing circuit is described in which only a maximum value of the envelope after a reproduced RF signal is A/D-converted is detected and the maximum value is supplied to the A/D converter. Also, the detecting operation of the maximum value is performed for a predetermined time period, for example, when the mode of a system is changed from the stop mode to the reproduction mode.

In Japanese Laid Open Patent Application (JP-A-Heisei 3-106269), an image data signal processing apparatus is described, in which a ratio of pixels having a level higher than a predetermined level of a dynamic range to all pixels is calculated and the characteristics of an image data signal outputted from an image sensor are changed based on the calculated ratio.

In Japanese Laid Open Patent Application (JP-A-Heisei 3-131177), an image data signal processing circuit is described in which an image data signal is supplied to a multiplier via an amplifier and an A/D converter and an area value of an image data signal higher than a predetermined level which is near to a saturation level is detected. The gain of the amplifier is controlled based on the area value, and a peak value and average value of the output of the A/D converter.

In Japanese Laid Open Patent Application (JP-A-Heisei 6-319060), an image data signal processing circuit is described which is composed of an A/D converter, a filter circuit for a pilot burst signal, and a switch for selectively outputting one of the output of the A/D converter and the output of the filter circuit. In this conventional example, a sync chip level detecting circuit holds a DC component of an image data signal to output to the A/D converter and a predetermined voltage is also supplied to the A/D converter.

SUMMARY OF THE INVENTION

The present invention is accomplished from the viewpoint of the above problems. An object of the present invention is to provide an image data signal processor in which an image data signal can be set to a quantization range of an A/D converter.

Another object of the present invention is to provide an image data signal processor which can improve the minimum resolution of an A/D converter without increasing the number of bits of the A/D converter.

Still another object of the present invention is to provide an image data signal processor in which the degradation of a S/N ratio of an image data signal due to a quantization error of an A/D converter can be held in minimum.

Yet still another object of the present invention is to provide an image data signal processor in which the dynamic range of an A/D converter can be dynamically changed.

It is an object of the present invention to provide a method of widening the dynamic range of an A/D converter in an image data signal processor.

In order to achieve an aspect of the present invention, an image data signal processor includes a clamp circuit for clamping a DC level of an image data signal to a predetermined level to produce a clamped image data signal, an A/D converter for A/D-converting the clamped image data signal into a digital image data signal based on a lower reference voltage and an upper reference voltage, wherein the predetermined level is a minimum level of the A/D converter, and a reference voltage generating section for generating the lower and upper reference voltages from the digital image data signal to send to the A/D converter.

It is preferable that the reference voltage generating section dynamically generates the lower and upper reference voltages from the digital image data signal to send to the A/D converter.

The reference voltage generating section may detect a maximum voltage level and minimum voltage level of the digital image data signal to send to the A/D converter as the lower and upper reference voltages, respectively. Alternately, the reference voltage generating section may change the lower and upper reference voltages in accordance with the digital image data signal and sends the change. The reference voltage generating section is realized in software.

The image data signal processor may further include a DC level reproducing circuit for reproducing a DC level of the digital image data signal based on the lower reference voltage from the reference voltage generating section.

In order to achieve another aspect of the present invention, an image data signal processor includes a clamp circuit for clamping a DC level of an image data signal to a predetermined level to produce a clamped image data signal, a level detecting circuit for detecting a maximum voltage level and minimum voltage level of the clamped image data signal for a window of the claimed image data signal to generate a lower reference voltage and an upper reference voltage, respectively, and an A/D converter for A/D-converting the clamped image data signal into a digital image data signal based on the lower reference voltage and the upper reference voltage, wherein the predetermined level is a minimum level of the A/D converter.

The level detecting circuit may detect the maximum voltage level and minimum voltage level of the clamped image data signal for every window of the claimed image data signal to generate the lower reference voltage and the upper reference voltage.

In order to achieve still another aspect of the present invention, a method of widening a dynamic range of an A/D converter in an image data signal processor, includes the steps of:

clamping a DC level of an image data signal to a minimum level of an A/D converter to produce a clamped image data signal;

generating a lower reference voltage and an upper reference voltage based on the clamped image data; and A/D-converting the clamped image data signal into a digital image data signal based on the lower reference voltage and the upper reference voltage.

DESCRIPTION OF THE PREFERRED EMBODIMENTS

Next, the image data signal processor of the present invention will be described below in detail with reference to the accompanying drawings.

Figure 2:
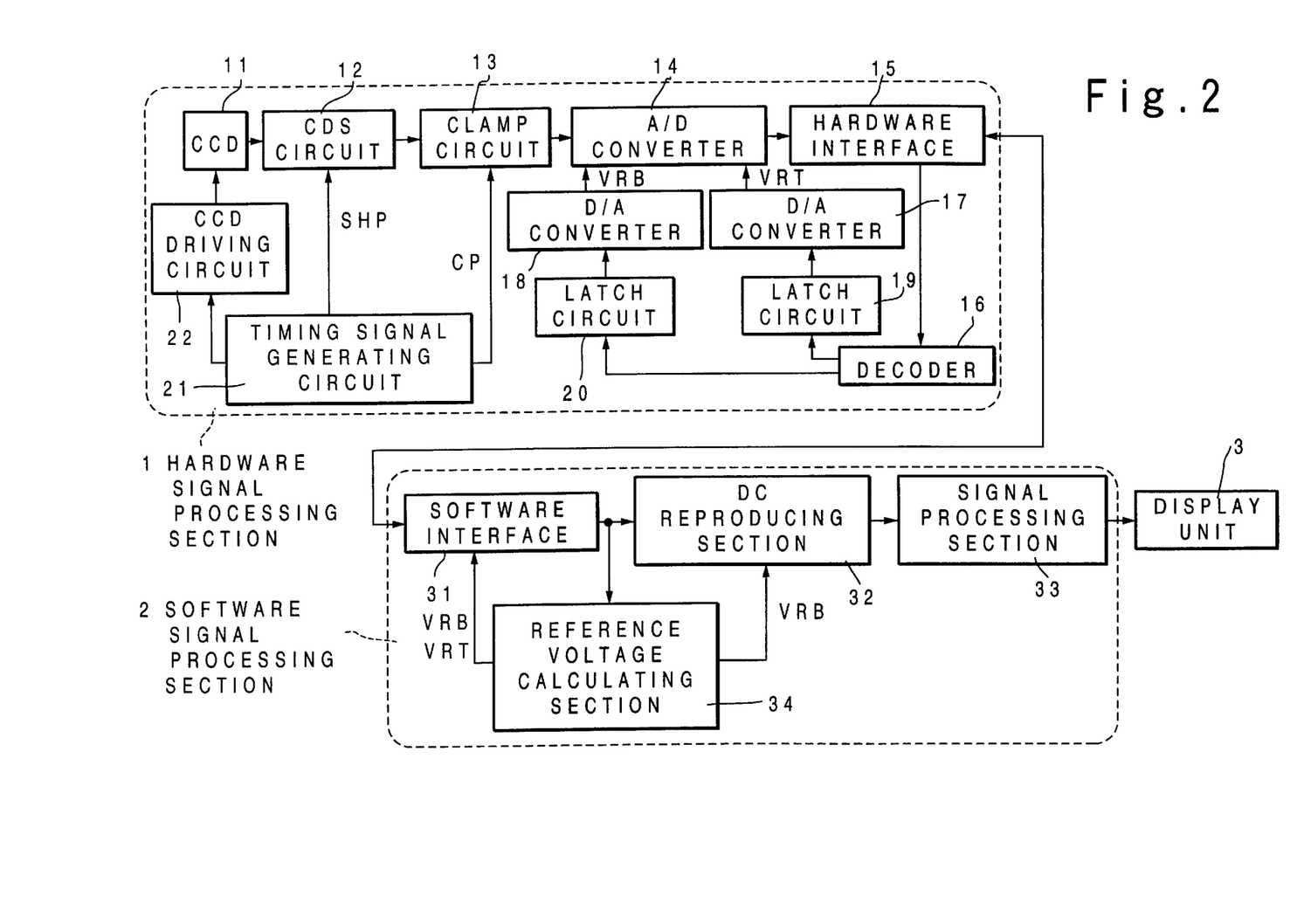
FIG. 2 is a block diagram illustrating the structure of an image data signal processor according to a first embodiment of the present invention.

FIG. 2 shows the structure of the image data signal processor according to the first embodiment of the present invention. Referring to FIG. 2, the image data signal processor in this embodiment is composed of a hardware signal processing section 1 and a software signal processing section 2. The software signal processing section 2 is composed of a CPU such as a digital signal processor (not shown) and a memory (not shown) for storing a software program which is executed by the CPU to accomplish the following function.

The hardware signal processing section 1 is composed of a charge coupled device (CCD) 11, a correlated double sampling (CDS) circuit 12, a clamp circuit 13, an A/D converter 14, a hardware interface 15, a decoder 16, D/A converters 17 and 18, latch circuits 19 and 20, a timing signal generating circuit 21 and a CCD driving circuit 22.

The timing signal generating circuit 21 generates a drive timing signal indicative of the timing at which the CCD 11 is to be driven. Also, the timing signal generating circuit 21 generates a sampling timing signal (SHP) indicative of the timing at which an image data signal outputted from the CCD 11 is to be sampled. Further, the timing signal generating circuit 21 generates a clamp timing signal (CP) indicative of the timing at which analog signal processing is to be performed.

The CCD driving circuit 22 receives the drive timing signal from the timing signal generating circuit 21 to drive the CCD 11 in response to the drive timing signal. The CCD 11 is an image sensor, and is driven by the CCD driving circuit 22 to output an analog image data signal.

An image data signal is inputted to the CDS (correlated double sampling) circuit 12. The CDS circuit 12 receives the sampling timing signal from timing generator 21 and performs correlated double sampling to the image data signal from the CCD 11 in response to the sampling timing signal. After that, the sampled image data signal is supplied to the clamp circuit 13, and is clamped to the minimum voltage level of the A/D converter 14, for example, to 1 V, at the timing of the clamp timing signal CP from the timing signal generating circuit 21.

The A/D converter 14 is supplied with an upper reference voltage VRT from the D/A converter 17 and a lower reference voltage VRB supplied from the D/A converter 18. The A/D converter 14 converts the clamped analog image data signal into a digital image data signal with the gradation of the A/D converter 14. For instance, if an 8-bit A/D converter is used, the clamped image data signal is converted into 256 gradation levels based on the upper reference voltage VRT and the lower reference voltage VRT. For example, when the A/D converter 14 has the upper reference voltage of 2 V and the lower reference voltage of 1V, one bit of the analog image data signal is equivalent to 3.91 mV (=1/256), because the range of 1 V is resolved into 256 gradation levels.

The digital image data signal is supplied to the software signal processing section 2 through the hardware interface 15. The hardware interface 15 sends the digital image data signal to the software signal processing section. Also, the hardware interface 15 supplies A/D converter reference voltage data from the software signal processing section 2 to the decoder 16.

The decoder 16 decodes the A/D converter reference voltage data from the hardware interface 15 into the lower reference voltage data and the upper reference voltage data for the A/D converter 14, and outputs the lower reference voltage data and the upper reference voltage data to the latch circuits 20 and 19, respectively. The latch circuit 20 outputs the lower reference voltage data to the D/A converter 18 and the latch circuit 19 outputs the upper reference voltage data to the D/A converter 17. The D/A converter 18 converts the digital lower reference voltage data into the analog lower reference voltage data signal to output to the A/D converter 14 as the lower reference voltage. On the other hand, the D/A converter 17 converts the digital upper reference voltage into the analog maximum reference data signal to output to the A/D converter 14 as the upper reference voltage. The A/D converter 14 converts the clamped analog image data signal into the digital image data in the range of the lower reference voltage and the upper reference voltage.

The software signal processing section 2 is composed of a software interface 31, a DC reproducing section 32, a signal processing section 33 and a reference voltage calculating section 34.

The software interface 31 is the interface which makes bidirectional data transfer possible. The digital image data signal from the hardware signal processing section 1 is supplied to the DC reproducing section 32 and the reference voltage calculating section 34 through the software interface 31. The DC reproducing section 32 receives the lower reference voltage (VRB) data from the reference voltage calculating section 34 and adds a DC component from the pedestal level of the image data signal to the lower reference voltage of the A/D converter 14 to reproduce the image data signal in a DC manner. Various types of signal processing is performed on the image data signal in which the DC level has been reproduced, by the signal processing section 33 and then is supplied to the display unit 3.

The reference voltage calculating section 34 calculates the lower reference voltage and the upper reference voltage for the A/D converter 14 in the hardware signal processing section 1 from the digital image data signal and outputs them to the software interface 31. In this case, there are various imaged scenes and as the result of these scenes the image data signal possibly has various states. Therefore, the reference voltage calculating section 34 calculates the reference voltages for the A/D converter 14 in the image data signal states such that the calculation values of the reference voltages for the A/D converter 14 changes dynamically in accordance with the state of the image data signal. The software interface 31 sends out the reference voltage data which has been calculated by the reference voltage calculating section 34, to the hardware signal processing section 1.

Figure 3:
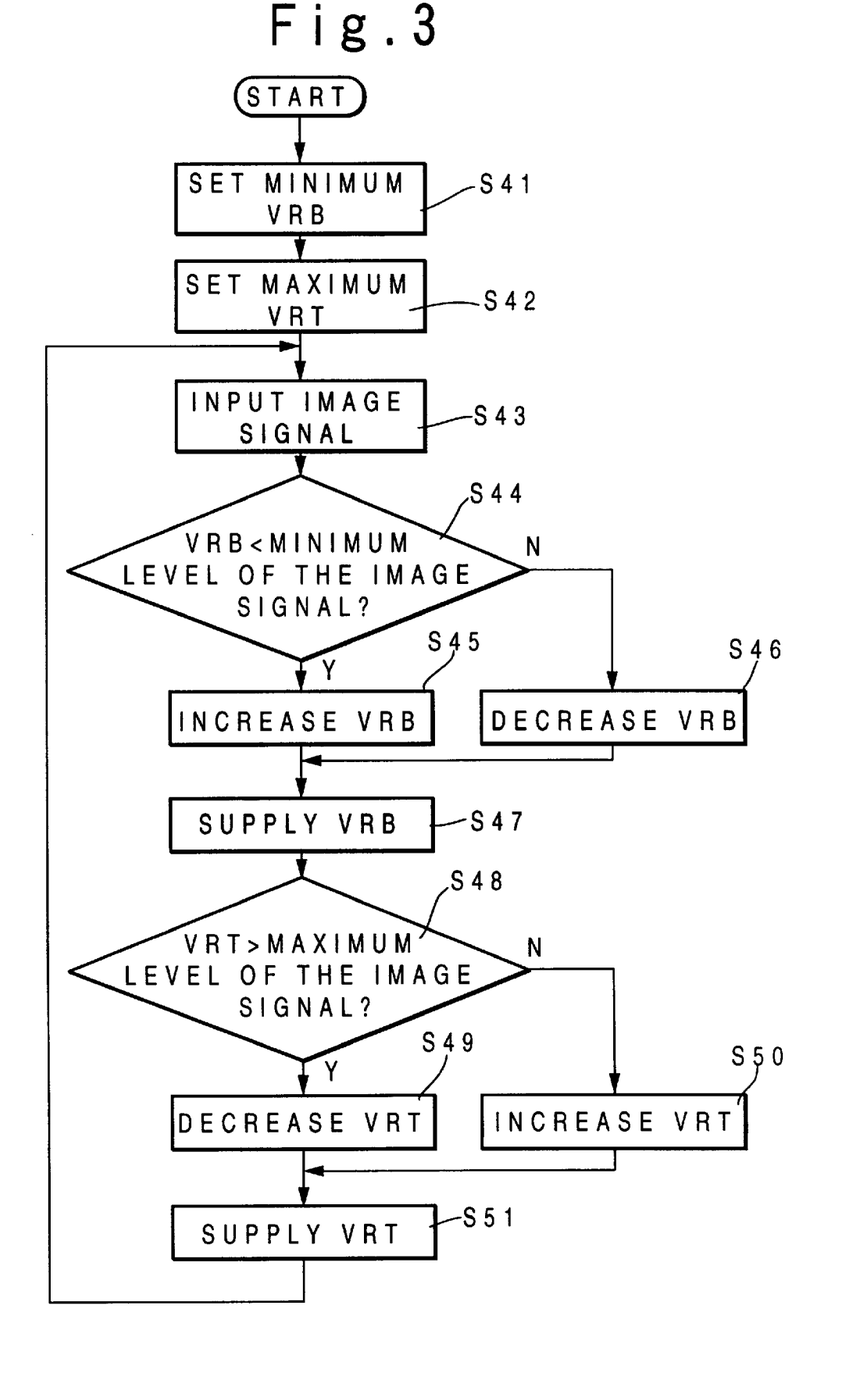
FIG. 3 is a flow chart illustrating the operation of a reference voltage calculating section 34 shown in FIG. 2.

FIG. 3 is a flow chart illustrating the operation of the reference voltage calculating section 34.

Referring to FIG. 3, the reference voltage calculating section 34 initializes the lower reference voltage value (VRB) and the upper reference voltage value (VRT) which should be set in the A/D converter 14, to predetermined initial values in steps S41 and S42. The initial values at this time are set such that the dynamic range becomes maximum in the A/D converter. For example, when the minimum voltage level of the A/D converter 14 is 1 V, the minimum voltage level can be expressed as $00_H$ with 8 bits, and is set as the lower reference voltage. Also, when the maximum voltage level is 2 V, the maximum voltage level can be expressed as $FF_H$ with 8 bits, and is set as the upper reference voltage.

The software interface 31 supplies the digital image data signal to the reference voltage calculating section 34 in a step S43.

The reference voltage calculating section 34 compares the minimum value of the digital image data signal and lower reference voltage value (VRB) in a step S44. When it is determined that the lower reference voltage value is smaller than the minimum value of the digital image data signal, the reference voltage calculating section 34 increases the lower reference voltage in a step S45. On the other hand, when it is determined that the lower reference voltage is not smaller, the reference voltage calculating section 34 decreases the lower reference voltage value in a step S46. Subsequently, the reference voltage calculating section 34 sends out this lower reference voltage to the software interface 31 in a step S47.

Next, the reference voltage calculating section 34 compares the maximum level of the digital image data signal and the upper reference voltage value (VRT) in a step S48. When it is determined that the upper reference voltage is larger than the maximum level of the digital image data signal, the reference voltage calculating section 34 decreases the upper reference voltage value in a step S49. On the other hand, when it is determined that the upper reference voltage value is not larger, the reference voltage calculating section 34 increases the upper reference voltage value in a step S50. Subsequently, the reference voltage calculating section 34 sends out this upper reference voltage value to the software interface 31 in a step S51.

Hereinafter, the above-mentioned operation is repeated based on the digital image data signal supplied from the hardware signal processing section 1.

When the A/D converter of 8 bits is used, the increasing or decreasing value of the lower and upper reference voltage data is performed in units of bits so that the resolution is sufficiently accomplished.

Next, the operation of setting the reference voltages by the A/D converter 14 will be described below.

The software interface 31 supplies the reference voltage data from the reference voltage calculating section 34 to the hardware signal processing section 1. The hardware interface 15 supplies the inputted reference voltage data to the decoder 16.

The decoder 16 determines whether the inputted reference voltage data is the lower reference voltage data or the upper reference voltage value. When the inputted reference voltage data is the lower reference voltage data, the decoder 16 supplies the lower reference voltage value to the latch circuit 20. On the other hand, when the inputted reference voltage data is the upper reference voltage data, the decoder 16 supplies the upper reference voltage value to the latch circuit 19.

The latch circuits 19 and 20 maintain the supplied reference voltage data until subsequent reference voltage data are supplied. The latch circuit 20 outputs the lower reference voltage to the D/A converter 18 and the latch circuit 19 outputs the upper reference voltage to the D/A converter 17 when the subsequent reference voltage data are supplied, respectively.

The D/A converter 18 converts the supplied reference voltage data into the analog reference data signal to supply to the A/D converter 14 as the lower reference voltage. On the other hand, the D/A converter 17 converts the supplied reference voltage data into the analog reference voltage signal to output to A/D converter 14 as the upper reference voltage.

The A/D converter 14 converts the clamped image data signal into the digital image data signal in the range of the lower reference voltage and the upper reference voltage.

Next, an example of the operation of the reference voltage calculating section 34 will be described below.

Figure 4:
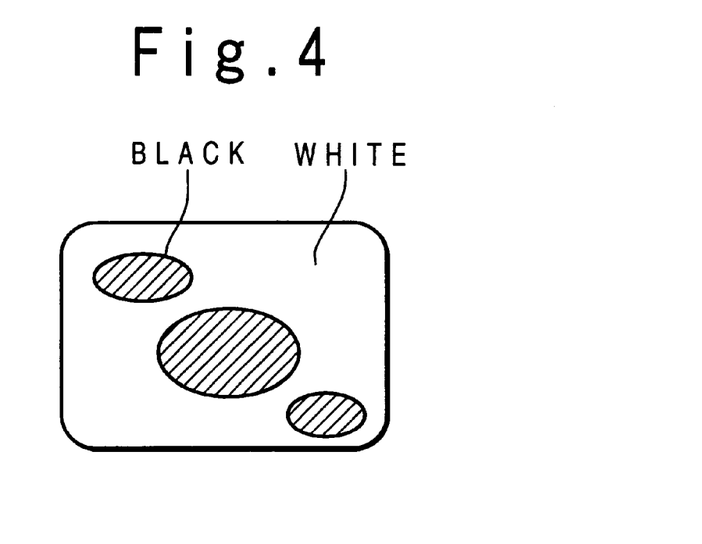
FIG. 4 is a diagram illustrating the screen when a subject of high contrast is imaged.
Figure 5:
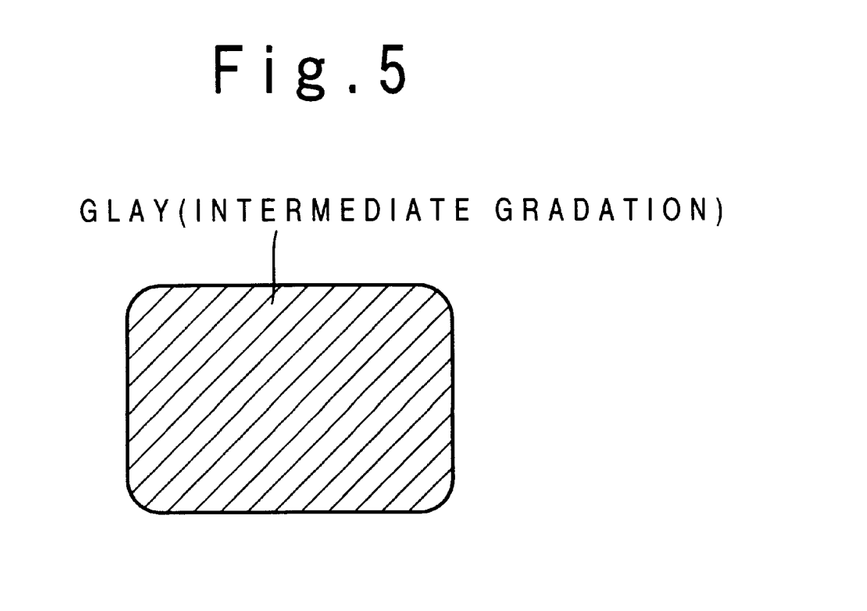
FIG. 5 is a diagram illustrating the screen when a subject of low contrast is imaged.

FIGS. 4 and 5 are diagrams illustrating the screen when a subject of high contrast is imaged and the screen when a subject of low contrast is imaged, respectively.

Figure 6:
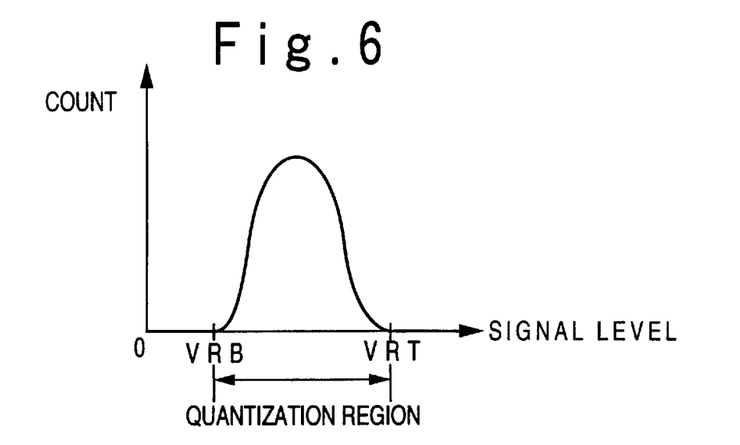
FIG. 6 is an example of a histogram of signal level when the subject of low contrast is imaged.

For instance, when the subject shown in FIG. 5 is imaged, the signal levels for the whole screen centers on the intermediate level region. Therefore, when a distribution of signal levels is calculated, the histogram as shown in FIG. 6 is obtained.

Figure 7:
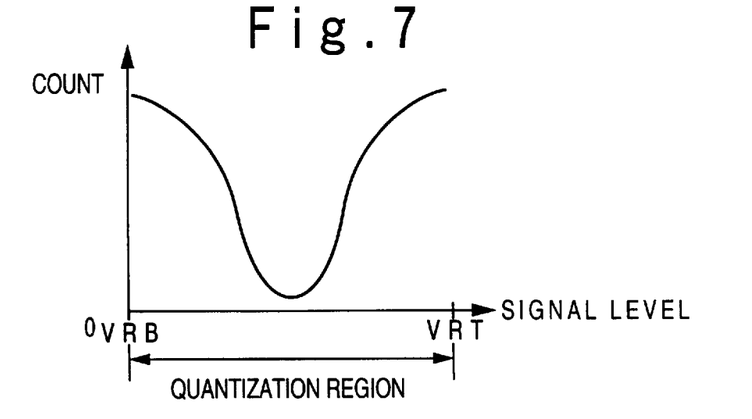
FIG. 7 is an example of a histogram of signal level when the subject of high contrast is imaged.

On the other hand, when the subject shown in FIG. 4 is imaged, the signal levels centers on the high brightness region and the low brightness regions. Therefore, when a distribution of signal levels is calculated, a histogram as shown in FIG. 7 is obtained.

Figure 8:
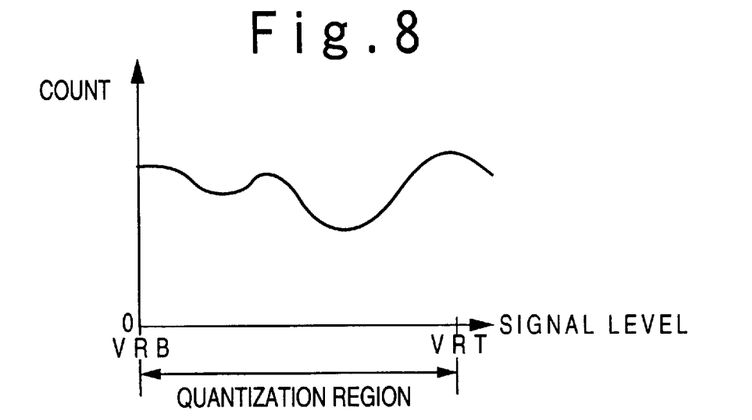
FIG. 8 is an example of a histogram of signal level when a subject of uniform contrast is imaged.

FIG. 8 shows the histogram when the signal level of the whole screen is relatively equally distributed.

For instance, when the screen is in the state as shown in FIG. 5, the reference voltage calculating section 34 operates to make the maximum image data signal level and the upper reference voltage of the A/D converter 14 coincident and the minimum image data signal level and the lower reference voltage of the A/D converter 14 coincident.

If an 8-bit A/D converter having the lower reference voltage of 1 V and the upper reference voltage of 2 V is used as the A/D converter 14, the image data signal of 1 Vp-p is resolved with 8 bits. Therefore, the resolution per one bit is 3.91 mV. Thus, as shown in FIG. 6, when the distribution of signal levels is small, the reference voltage calculating section 34 operates to narrow the quantization range of the A/D converter 14.

For instance, when the image data signal is converged in a range of the lower reference voltage of 1.2 V and the upper reference voltage of 1.7 V, the voltage range of 0.5 Vp-p is resolved with 8 bits. Therefore, the resolution per one bit becomes 1.95 mV and the resolution is improved. In this manner, the resolution is improved by about twice as compared to the above-mentioned example, and the quantization error of the A/D converter 14 become about ½. Therefore, an S/N ratio of the whole system can be improved only when an S/N ratio of the A/D converter 14 is lower than that of the CCD 11.

For instance, when the screen is in the state shown in FIG. 4, the reference voltage calculating section 34 operates to widen the quantization range of the A/D converter 14. For instance, when the image data signal is converged in a range of the lower reference voltage of 1 V and the upper reference voltage value of 2 V, the resolution of the A/D converter 14 is not improved. However, the image data signal is never saturated.

Also, when the signal levels of the image data signal are as dispersed in the wide range as shown in FIG. 8, the reference voltage calculating section 34 operates to widen the quantization range of the A/D converter 14.

In this manner, the lower reference voltage and upper reference voltage of the A/D converter 14 are set to be coincident with the minimum level and maximum level of the image data signal, so that an appropriate image data signal can be reproduced for every picture scene.

In the first embodiment, because the reference voltages are calculated by the software, any special hardware is not necessary. As a result, the system can be realized with low cost and small size and with low power consumption.

Also, the calculation of the reference voltages is dynamically performed. However, the calculation may be performed only for a predetermined time period, for example, only in an initial state of supply of the digital image data signal.

It should be noted that the reference voltage calculating section 34 may detect the maximum level and minimum level of the image data signal and immediately set the upper reference voltage and lower reference voltage for the A/D converter 14 to be equal to the detected maximum level and minimum level of the image data signal.

Figure 9:
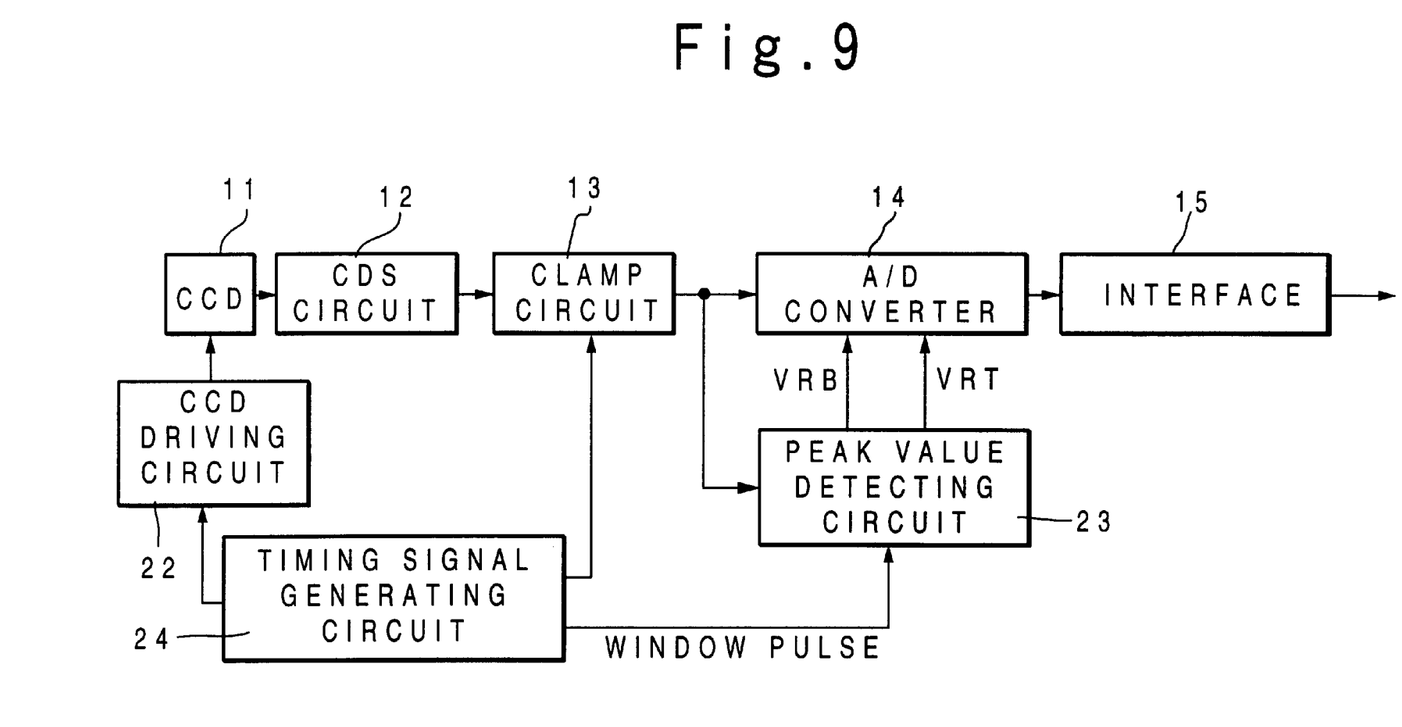
FIG. 9 is a block diagram illustrating the structure of the image data signal processor according to the second embodiment of the present invention.

Next, the image data signal processor according to the second embodiment of the present invention will be described below. FIG. 9 is a block diagram illustrating the structure of the image data signal processor in the second embodiment.

Referring to FIG. 9, the image data signal processor of this embodiment is composed of the CCD 11, the CDS circuit 12, the clamp circuit 13, the A/D converter 14, the hardware interface 15, the CCD driving circuit 22, a peak value detecting circuit 23 and a timing signal generating circuit 24. In this case, the CCD 11, the CCD driving circuit 22, the CDS circuit 12, clamp circuit 13, the A/D converter 14 and the hardware interface 15 have the same structure as in the first embodiment and operate in the same manner as in the first embodiment.

An image data signal is supplied from the clamp circuit 13 to the A/D converter 14 and the peak value detecting circuit 23. The image data signal is converted into a digital image data signal based on a lower reference voltage (VRB) and a upper reference voltage (VRT) supplied from the peak value detecting circuit 23 to the A/D converter 14.

At this time, the peak value detecting circuit 23 receives a signal indicative of an image data signal range, i.e., a window pulse signal from the timing signal generating circuit 24 and detects the minimum level and the maximum level of the image data signal from the effective horizontal and vertical ranges of the image data signal. The detected minimum level and maximum level are supplied to the A/D converter 14 as the lower reference voltage and the upper reference voltage for the A/D converter 14. The A/D converter 14 converts the image data signal into the digital image data signal in the range of the detected minimum level and the maximum level.

In the second embodiment, the processing of software and so on is not used, and the image data signal processor can be realized with hardware. Thus, it is not necessary to perform complicated system design. Therefore, the image data signal processor can be applied to a small video camera and a still camera.

Also, the D/A converters 17 and 18, the latch circuits 19 and 20 and the decoder 16 which are used in the first embodiment are not required. Therefore, the reduction of the circuit scale, the cost reduction by it, and the low power consumption can be realized.

As the described above, according to is image data signal processor of the present invention, the minimum resolution when the image data signal from the CCD is A/D converted can be improved without increasing the number of bits of the A/D converter. Also, when a subject of low contrast is imaged, the degradation of a S/N ratio due to the quantization error of the A/D converter can be reduced, as compared to the case when a subject of high contrast is imaged. Further, when the amplitude of the image data signal is large, the image data signal is never saturated. In addition, calculation of the reference voltages for the A/D converter becomes very easy.

What is claimed is:

1. An image data signal processor comprising:
   a clamp circuit for clamping a DC level of an analog image data signal to a predetermined level to produce a clamped analog image data signal;
   an A/D converter for converting said clamped analog image data signal into a digital image data signal based on a lower reference voltage and an upper reference voltage, wherein said predetermined level is a minimum level of said A/D converter; and
   a reference voltage generating section for generating said lower and upper reference voltages from said analog image data signal to send to said A/D converter, and wherein
   said reference voltage generating section is connected to said A/D converter for delivering said lower and upper reference voltages thereto.

2. An image data signal processor according to claim 1, wherein said reference voltage generating section dynamically generates said lower and upper reference voltages from said analog image data signal to send to said A/D converter.

3. An image data signal processor according to claim 1, wherein said reference voltage generating section detects a maximum voltage level and minimum voltage level of said analog image data signal to send to said A/D converter as said lower and upper reference voltages, respectively.

4. An image data signal processor according to claim 1, wherein said reference voltage generating section changes said lower and upper reference voltages in accordance with said analog image data signal and sends the changed lower and upper reference voltages to said A/D converter as new lower and upper reference voltages, respectively.

5. An image data signal processor comprising:
   a clamp circuit for clamping a DC level of an analog data signal to a predetermined level to produce a clamped analog image data signal;
   a level detecting circuit, for detecting a minimum voltage level and a maximum voltage level of said clamped analog image data signal for a window of said clamped analog image data signal, for generating a lower reference voltage and an upper reference voltage, corresponding to a magnitude of said minimum voltage level and maximum voltage level, respectively; and
   an A/D converter connected to said level detecting circuit for receiving said lower and upper reference voltages for converting said clamped analog image data signal into a digital image data signal based on said lower reference voltage and said upper reference voltage, and wherein said predetermined level is a minimum level of said A/D converter.

6. An image data signal processor according to claim 5, wherein said level detecting circuit detects said maximum voltage level and minimum voltage of said clamped analog image data signal for every window of said clamped analog image data signal to generate said lower reference voltage and said upper reference voltage.

7. A method of adjusting a dynamic range of an A/D converter in an image data signal processor, comprising the steps of:
   clamping a DC level of an analog image data signal to a minimum level of an A/D converter to produce a clamped analog image data signal;
   generating a lower reference voltage and an upper reference voltage based on said clamped analog image data;
   A/D-converting said clamped analog image data signal into a digital image data signal based on said lower reference voltage and said upper reference voltage, and providing said lower and upper reference voltages to said A/D converter.

8. A method according to claim 7, wherein said step of generating a lower reference voltage and an upper reference voltage is dynamically performed with said analog image data signal.

9. A method according to claim 8, wherein said step of generating a lower reference voltage and an upper reference voltage includes generating said lower reference voltage and said upper reference voltage based on said analog image data signal.

10. A method according to claim 8, wherein said generating a lower reference voltage and an upper reference voltage includes detecting a maximum voltage level and a minimum voltage level of said analog image data signal as said lower and upper references voltages, respectively.

11. A method according to claim 8, wherein
   said generating a lower reference voltage and an upper reference voltage includes changing said lower and upper reference voltages in accordance with said analog image data signal.

12. A method according to claim 8, wherein
   said generating a lower reference voltage and an upper reference voltage includes detecting a maximum voltage level and a minimum voltage level of said clamped analog image data signal for a window of said clamped analog image data signal to generate said lower reference voltage and said upper reference voltage, respectively.

13. An image data signal processor according to claim 5, wherein said reference voltage generating section dynamically generates said lower and upper reference voltages from said analog image data signal to send to said A/D converter.

14. An image data signal processor according to claim 5, wherein said reference voltage generating section changes said lower and upper reference voltages in accordance with said analog image data signal and sends the changed lower and upper reference voltages to said A/D converter as new lower and upper reference voltages, respectively.

15. An image data signal processor according to claim 5, wherein said converting of said clamped analog image data signal into said digital image data signal utilizes said lower reference voltage and said upper reference voltage to define a converting range of A/D conversion.

16. An image data signal processor according to claim 7, wherein said A/D-converting of said clamped analog image data signal into said digital image data signal utilizes said lower reference voltage and said upper reference voltage to define a converting range of A/D conversion.

* * * * *